(12) United States Patent
Buter et al.

(10) Patent No.: US 8,198,756 B2
(45) Date of Patent: Jun. 12, 2012

(54) VOLTAGE-BOOSTING STAGE

(75) Inventors: Berry A. J. Buter, Veldhoven (NL);
Alexandre Huffenus, Duttleheim (FR)

(73) Assignee: NXP B.V., Eindhoven (NL)

( * ) Notice: Subject to any disclaimer, the term of this patent is extended or adjusted under 35 U.S.C. 154(b) by 429 days.

(21) Appl. No.: 12/447,175

(22) PCT Filed: Oct. 19, 2007

(86) PCT No.: PCT/IB2007/054261
§ 371 (c)(1),
(2), (4) Date: Apr. 24, 2009

(87) PCT Pub. No.: WO2008/050272
PCT Pub. Date: May 2, 2008

(65) Prior Publication Data
US 2010/0038972 A1    Feb. 18, 2010

(30) Foreign Application Priority Data

Oct. 26, 2006 (EP) .................................. 06122999

(51) Int. Cl.
*H02M 3/181* (2006.01)
(52) U.S. Cl. ........................................ 307/110
(58) Field of Classification Search .............. 307/110; 323/209, 217, 229; 363/10, 15, 37
See application file for complete search history.

(56) References Cited

U.S. PATENT DOCUMENTS

| 5,506,493 A | 4/1996 | Stengel |
| 5,734,205 A | 3/1998 | Okamura et al. |
| 5,960,898 A | 10/1999 | Okada et al. |
| 6,646,507 B1 * | 11/2003 | Prokin et al. ............... 330/207 A |
| 2006/0044056 A1 * | 3/2006 | Chen ............................ 327/560 |

FOREIGN PATENT DOCUMENTS

JP        2003348821     * 12/2003

OTHER PUBLICATIONS

Machine Translation for JP 2003-348821.*
Karsten Nielsen, "Parallel Phase Shifted Carrier Pulse Width Modulation (PSCPWM)—A novel approach to switching power amplifier design," Mar. 22, 1997, p. 1-26, Bang & Olufsen, Denmark and Institute of Automation, Technical University of Denmark.

* cited by examiner

*Primary Examiner* — Rexford N Barnie
*Assistant Examiner* — Toan Vu

(57) ABSTRACT

The invention relates to a voltage-boosting stage (100) comprising a first capacitive voltage circuit (S1, S2, S3, S4, C0, Cb) coupled to a power supply (Vs) and providing an output voltage at an output terminal. The voltage-boosting stage further comprises a second capacitive voltage circuit (S5, S6, S7, S8, C1, Cb) coupled to a power supply (Vs) and providing another output voltage at another output terminal the output terminal and the other terminals being coupled together and further coupled to a supply terminal of a power stage (S9, S10) for implementing a two-level boosted power stage.

18 Claims, 4 Drawing Sheets

VOLTAGE-BOOSTING STAGE

FIELD OF THE INVENTION

The invention relates to a voltage-boosting stage and to a power amplifier comprising such a stage.

BACKGROUND OF THE INVENTION

Class D amplifiers, comprising switching power stages are used in many applications because of their efficiency. The output signal of such an amplifier is a pulse-width modulated (PWM) signal, which is low-pass filtered for obtaining the amplified analog signal. To reduce the high-frequency content, and simplify filtering, multi-level PWM signals, which more closely represent the input signal may be used. To drive the load with a multi-level PWM signal an output stage that can reproduce multiple output levels is required. The amount of power that can be delivered to the loudspeaker load depends on the available supply voltage and the loudspeaker load impedance. The maximum sinewave power that can be delivered to the load is calculated in equation 1 below, where Vs represents the supply voltage, which sets the maximum amplitude of the sinewave and Rload the load impedance.

$$Pload = \frac{V_s^2}{2Rload} \quad (1)$$

To increase the amount of power that can be delivered to the load the supply voltage can be increased or the load impedance lowered or a combination of both options can be used. The loudspeaker load impedance cannot be made infinitely small and the available supply voltage is often fixed. This especially holds for portable devices where the supply is a battery with a given cell voltage. To increase the amount of power that can be delivered to the load the supply voltage must be boosted. The switching power-stage of a class-D amplifier is then operated from the boosted power supply with a voltage value of NVs as shown in FIG. 1. When the supply voltage is e.g. doubled i.e. N=2, then the maximum power that can be delivered to the loudspeaker load is quadrupled. A common way to boost the supply voltage is to use an inductive DC/DC converter. But a coil is a highly undesirable component. It is expensive and has a large footprint. A capacitive DC/DC converter to boost the supply voltage is therefore preferable.

A known circuit using capacitors for boosting the supply voltage is a charge-pump. This capacitive voltage-doubler circuit has two states and is continuously switched between both states by operating the switches. In a first state, a capacitor C0 is charged to the supply voltage Vs. While capacitor C0 is charged, a buffer capacitor Cb delivers current to a load and it is discharged. Because a capacitor in parallel with the load Cb is discharged the output voltage drops. After the output voltage has dropped to a certain value, the circuit is switched to a second state. Capacitor C0 is connected in series with the supply voltage. Because of some charge redistribution between C0 and Cb the output voltage will be lower than 2Vs. After switching both capacitors C0 and Cb are discharged and the output voltage drops. After the output voltage has dropped below a certain value, the circuit is switched again to the previous state. Two different slopes in the output voltage can be distinguished. In the first state only buffer capacitor Cb supplies all the load current resulting in a faster drop in the output voltage compared to the second state where the load current is supplied by capacitor Cb and C0 in parallel. A resistance in series with capacitor Cb would cause an additional voltage step in the output voltage when the capacitive voltage-doubler circuit is switched from the second state to the first state caused by the additional load current which capacitor Cb has to deliver in the first state.

To avoid this problem a double-phase capacitive circuit as is shown in FIG. 2 may be used. In FIG. 2, the above-mentioned notations can be easily observed. The double-phase capacitive circuit has also two states and it is continuously switched between both states by operating the switches. In the double-phase capacitive voltage-doubler circuit two capacitors, C0 and C1 are switched. In the first state the capacitor C0 is charged to the supply voltage and capacitor C1 is connected in series with the supply and in parallel with capacitor Cb. In the second state the function of capacitor C0 and C1 are interchanged. Now capacitor C1 is charged to the supply and capacitor C0 is connected in parallel with capacitor Cb. In both states there is a capacitor in parallel with Cb and the slope of the output voltage drop is equal in both states.

SUMMARY OF THE INVENTION

Hence, it is a need to provide a voltage-boosting stage having a reduced number of components and no inductors. The invention is defined by the independent claims. Dependent claims define advantageous embodiments.

This object is defined by a voltage-boosting stage comprising:
  a first capacitive circuit coupled to a power supply and providing an output voltage at an output terminal,
  a second capacitive circuit coupled to a power supply and providing another output voltage at another output terminal, and
  the output terminal and the other terminal being coupled together and further coupled to a supply terminal of a half bridge power stage for implementing a two-level boosted power stage.

For reducing the number of components the capacitor Cb is omitted. In an embodiment of the invention each of the capacitive circuits comprises a first switch having a respective first terminal coupled to a negative terminal of the power supply and a respective second terminal coupled to a second switch, the second switch having a third terminal coupled to the respective second terminal of the respective first switch and further coupled to a first terminal of a respective capacitor, a second terminal of said capacitor being coupled to a fourth terminal of a respective third switch and to a fifth terminal of a respective fourth switch, the fourth switch being further coupled to respective output terminals of the respective capacitive circuit.

In another embodiment of the invention the voltage-boosting stage further comprises a fifth switch coupled between the output node and a positive terminal of the power supply, a sixth switch coupled between the output node and the negative terminal of the power supply and a seventh switch connected between the output terminals of the capacitive circuits and the output node for implementing a three-level supply-boosted power stage.

In a preferred embodiment, the power stage only comprises two capacitive circuits and the sixth switch. This has the advantage of reducing the number of switches of the three-level power stage without affecting the performance of the circuit.

In another embodiment of the invention one of the fourth switches comprises at least two switches having different equivalent resistances such that a balance between the equivalent resistances in different states of the circuit is obtained.

In an embodiment of the invention the bridge-tied load supply-boosted power stage comprises two capacitive circuits. Furthermore each of the capacitive circuits comprises at least a fourth switch, each comprising a plurality of switches having different areas. The fourth switch parts i.e. some of the plurality of switches of each of the voltage boosting stages are differently connected to each other in use for obtaining an equal output resistance.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
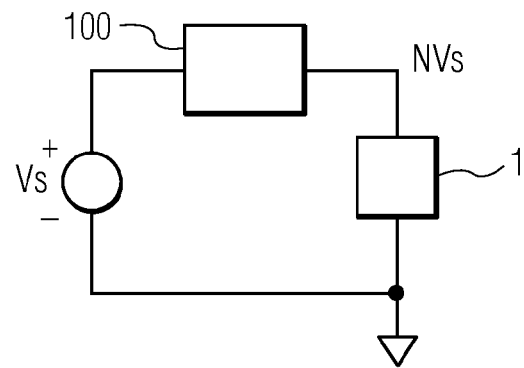
FIG. 1 depicts a supply-boosted class-D amplifier.
Figure 2:
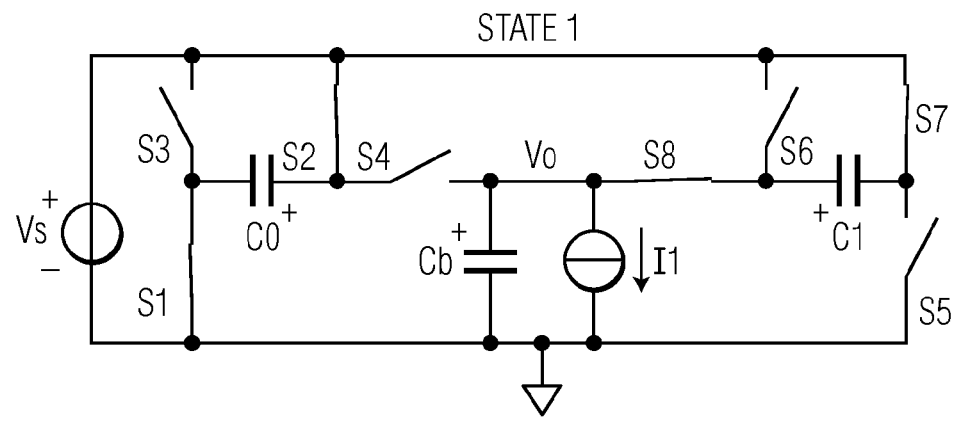
FIG. 2 depicts a prior art double-phase capacitive voltage doubler.
Figure 2:
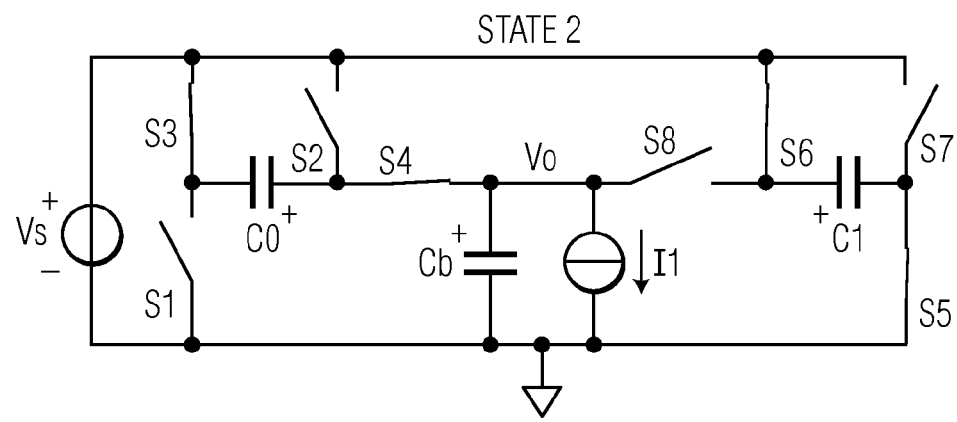
Figure 3:
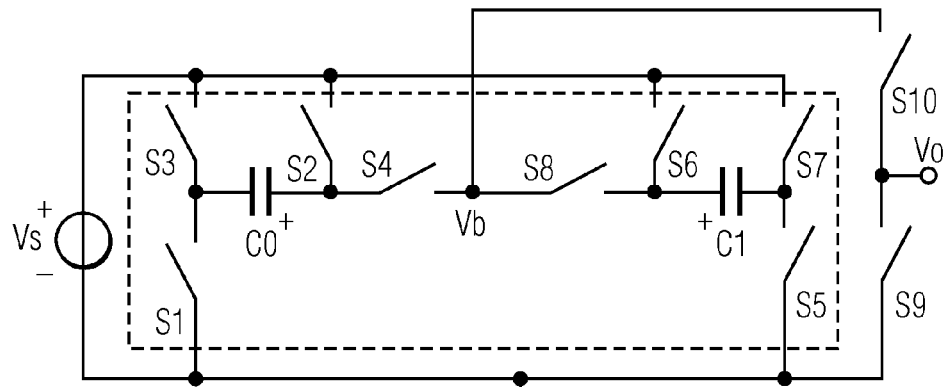
FIG. 3 depicts a two-level supply-boosted power stage, according to the invention.

A way to implement the voltage boosting stage is shown in FIG. 3, wherein the circuit in the dashed box generates a voltage equal to double the supply voltage at node Vb. The capacitive voltage-doubler circuit is switching continuously. The output may now be switched to ground level 0 by turning switch S9 ON and to a level equal to double the supply voltage 2Vs by turning switch S10 ON. The supply voltage Vs may also be used to generate an additional output level to realize a three-level power-stage.

Figure 4:
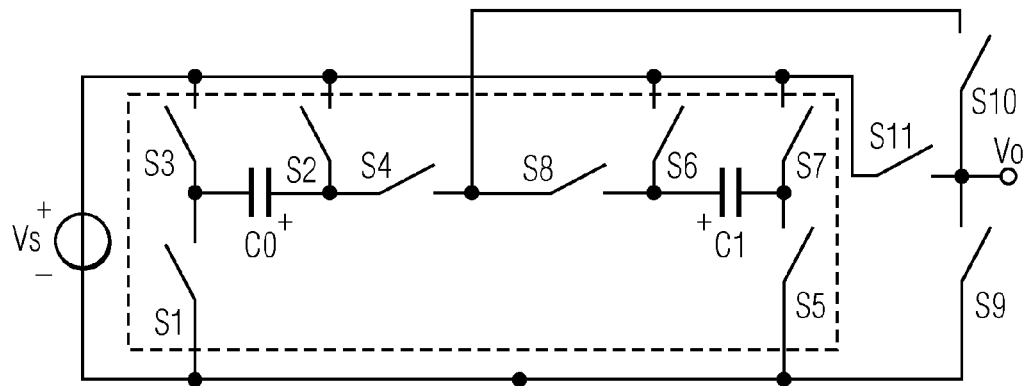
FIG. 4 depicts a three-level supply-boosted power stage, according to an embodiment of the invention.

To generate an output level equal to Vs an additional switch is required as shown in FIG. 4. The output may now be switched to ground level 0 by turning switch S9 ON, to a level equal to the supply voltage Vs by turning switch S11 ON and to a level equal to double the supply voltage 2Vs by turning switch S10 ON. For a linear transfer of the three-level power-stage it is important that the voltage level steps are equidistant and that the output impedance is equal for each voltage level. The output impedance for the low ground level and the Vs level are determined respectively by the switch impedance S9 and S11. The output impedance for the 2Vs level is set by the series connection of the capacitive voltage-doubler output impedance and the impedance of the switch S10. When the capacitor value of C0, C1 and the switch resistance are fixed the capacitive voltage-doubler impedance depends on the switching frequency. The output impedance is inversely proportional to fC when the switching time period is larger than a time constant τ, set by the capacitor and switch resistance. The output impedance is equal to four times a single switch impedance Rs when the switching time period is smaller than the time constant τ, assuming the impedances of the switches S1 to S8 are equal to each other. The lower bound of the capacitive voltage-doubler output impedance is 4Rs. Assuming that the switches S1 to S8 and S10 have the same impedance then this requires to have a single-switch impedance that is five times lower than that of the switches S9 and S11. The switches are normally implemented with transistors but also may be implemented with e.g. MEMS. The series connection of transistors increases the ohmic resistance. At the expense of an increase in transistor area the ohmic resistance of the transistors in series can be made equal to a single transistor. But the increased area results in larger switching losses.

Figure 5:
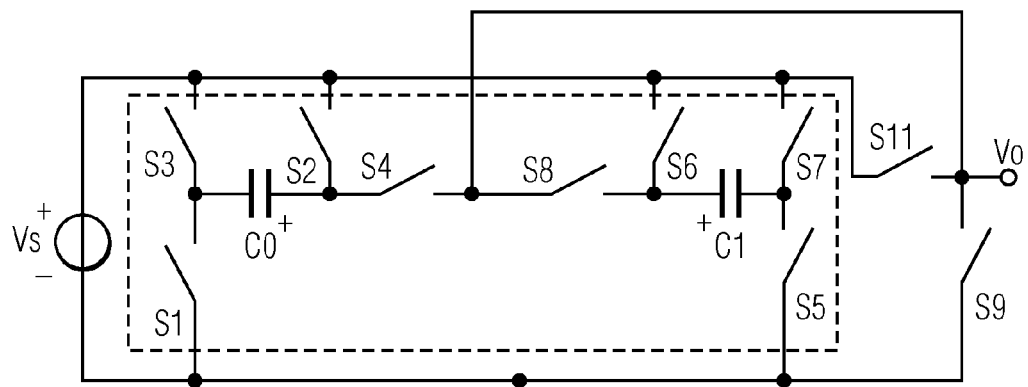
FIG. 5 depicts another embodiment of a three-level supply-boosted power stage, according to the invention.

An improved implementation of the power-stage where the output impedance of the 2Vs level is only determined by the capacitive voltage-doubler impedance is shown in FIG. 5. The capacitive voltage-doubler is now only operated when an output level of double the supply voltage needs to be generated eliminating the need for an additional series switch. When a level is generated of 0 or Vs the switches S1 to S8 are turned off and the capacitors C0 and C1 are kept floating. To generate an output level of Vs the switch pairs S2, S4 or S6, S8 can be used reducing the switch count even further. The output impedance of the level Vs is now not matched anymore. Assume that the switches S1 to S8 are equal and scaled to get an output impedance R for the 2Vs output level. Furthermore the switching time period is chosen to be much smaller than τ. The impedance of each of the switches S1 to S8 is then ¼ R. Using either of the switch pairs S2, S4 or S6, S8 to generate the level of Vs now results in an output impedance of ½ R. To obtain a matched output impedance one of the switches in the pairs S2, S4 or S6, S8 can be split-up in two parallel switches.

Figure 6:
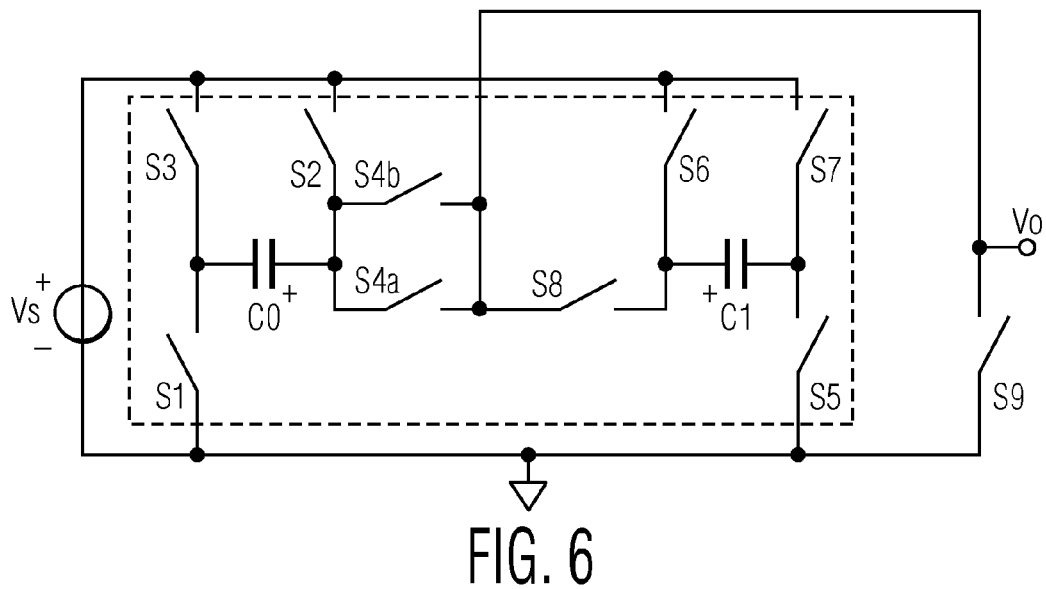
FIG. 6 depicts another embodiment of a three-level supply-boosted power stage, according to the invention.

This is shown in FIG. 6 for the case where the switch pair S2, S4 is used and S4 is split-up into two parallel switches S4a and S4b. The switch S4a is used to generate an output level of Vs. To get an output impedance match for the level Vs the switch S4a must be made equal to ¾ R, three times as large as the original impedance of S4. To generate the level 2Vs both switches S4a and S4b are used in parallel. The parallel combination of S4a and S4b must have an impedance of ¼ R, the impedance of S4b must thus be made one and a half times larger than the original switch impedance of S4. The impedance of the level 2Vs is then also R and matches the impedance of the other levels. The impedance of a MOS transistor used as switch is inversely proportional to the area, assuming the length is fixed and only the width is scaled. An increase in impedance results in a decrease of area. Assuming switch S4 occupies an area of A then the switches S4a respectively S4b occupy an area of ⅓ A respectively ⅔ A. The total area occupied by the parallel combination of the switches S4a and S4b is equal to the area of the original switch S4.

Figure 7:
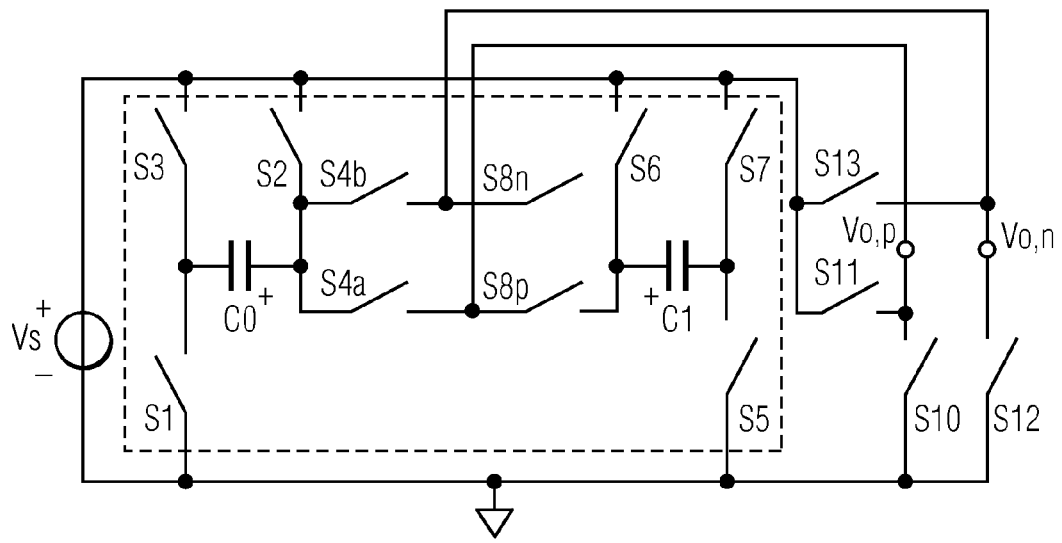
FIG. 7 depicts a five-level supply-boosted power stage, according to the invention.
Figure 9:
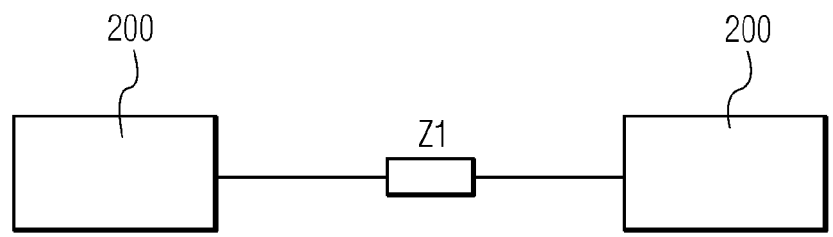
FIG. 9 depicts a bridge-tied load supply-boosted power stage, according to an embodiment of the invention.

A five-level supply-boosted power-stage may be built using two three-level supply-boosted power-stages in a bridge-tied-load (BTL) configuration as shown in FIG. 9. In FIG. 9, a load Z1 is coupled to each of its end to an output of a power amplifier 200, each power amplifier 200 being a supply-boosted class-D amplifier. Each power amplifier comprises a voltage multiplier 100 coupled to a half-bridge power-stage 1. Two voltage-doublers, each comprising two capacitive circuits are used. An optimized five-level supply-boosted power stage using only a single voltage-doubler in shown in FIG. 7. The parallel switches S4n, S4p respectively S8n, S8p allow the doubled supply voltage to be switched to the outputs Vo,p and Vo,n. Adding a common voltage to the outputs Vo,p and Vo,n does not change the differential output. The nine possible ways to generate the differential five-level output signal are shown in Table 1.

TABLE 1

Possible ways to generate the differential five level output signal

| Level | $V_{o,p}$ | $V_{o,n}$ | $V_o$ |
|---|---|---|---|
| −1 | 0 | $2V_s$ | $-2V_s$ |
| −½ | 0 | $V_s$ | $-V_s$ |
| 0 | $V_s$ | $V_s$ | 0 |
| ½ | $V_s$ | 0 | $V_s$ |
| 1 | $2V_s$ | 0 | $2V_s$ |

In this circuit the output impedance of the capacitive voltage-doubler for a 0 level output with a common signal of 2Vs can not be made equal to the output impedance of the other levels and should be avoided. For the five-level power-stage it is also possible to reuse the switches of the capacitive circuits.

Figure 8:
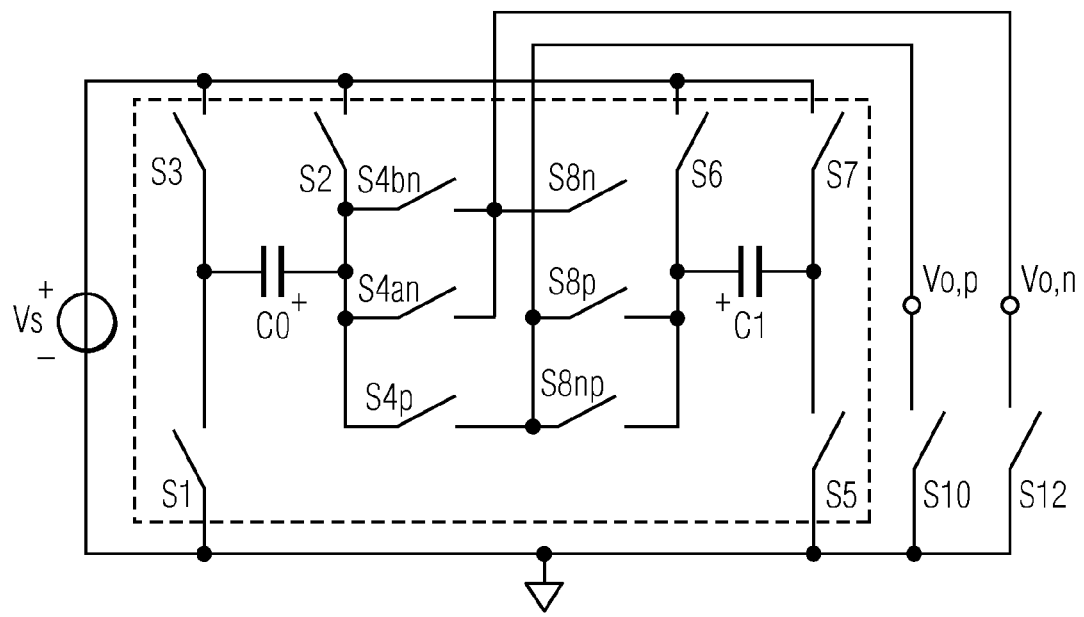
FIG. 8 depicts an embodiment of a five-level supply-boosted power stage, according to the invention.

This is shown in FIG. 8. The switches S4n and S8p are split-up to ensure equal output impedance for the different levels. The output-level combinations in Table 1 where on one output a level of Vs is needed and on the other output a level of 2Vs cannot be realized. A level of ±Vs is generated with a combination of a Vs level on one output and a 0 level on the other output.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A voltage-boosting stage comprising:
a first capacitive voltage circuit coupled to a power supply and providing a first output voltage at a first output terminal,
a second capacitive voltage circuit coupled to the power supply and providing a second output voltage at a second output terminal, the second output terminal and the first output terminal being coupled together and further coupled to a supply terminal of a power stage for implementing a two-level supply boosted power stage,
wherein the first and second capacitive circuits include a first switch having a respective first terminal coupled to a negative terminal of the power supply and a respective second terminal coupled to a second switch, the second switch having a third terminal coupled to the respective second terminal of the respective first switch and further coupled to a first terminal of a respective first or second capacitor, a second terminal of said first or second capacitor being coupled to a fourth terminal of a respective third switch and to a fifth terminal of a respective fourth switch, the fourth switch being further coupled to respective first or second output terminal of the first or second capacitive circuit, respectively, wherein one of the fourth switch comprises at least two related switches having different equivalent resistances.

2. The voltage-boosting stage as claimed in claim 1 further comprising a fifth switch coupled between the power stage and a positive terminal of the power supply for implementing a three-level supply-boosted power stage.

3. The voltage-boosting stage as claimed in claim 2, wherein the power stage comprises a sixth switch coupled between the first or second output terminal of the power stage and the negative terminal of the power supply.

4. The voltage-boosting stage according to claim 1, wherein the voltage-boosting stage is a bridge-tied load supply-boosted power stage.

5. The voltage-boosting stage according to claim 4, wherein the first, second, third, and fourth switches have different areas.

6. The voltage-boosting stage according to claim 5, further comprising, an amplifier comprising a first pair of switches coupled between amplifier outputs and a negative terminal of the supply voltage supplying the amplifier.

7. The voltage-boosting stage according to claim 6, wherein the amplifier includes a second pair of switches coupled between the amplifier outputs and the positive terminal of the supply voltage supplying the amplifier.

8. The voltage-boosting stage according to claim 1, further comprising a class-D power amplifier circuit including a switching power amplifier coupled to a voltage source via the voltage-boosting stage.

9. The voltage-boosting stage of claim 1, wherein the power stage comprises two switches.

10. The voltage-boosting stage of claim 1, wherein the power stage only comprises a single switch.

11. The voltage-boosting stage of claim 2, wherein the power stage only comprises the sixth switch.

12. A voltage-boosting stage comprising:
a first capacitive voltage circuit coupled to a power supply and providing a first output voltage at a first output terminal,
a second capacitive voltage circuit coupled to the power supply and providing a second output voltage at a second output terminal, the second output terminal and the first output terminal being coupled together and further coupled to a supply terminal of a power stage for implementing a two-level supply boosted power stage,
wherein the first and second capacitive circuits include a first switch having a respective first terminal coupled to a negative terminal of the power supply and a respective second terminal coupled to a second switch, the second switch having a third terminal coupled to the respective second terminal of the respective first switch and further coupled to a first terminal of a respective first or second capacitor, a second terminal of said first or second capacitor being coupled to a fourth terminal of a respective third switch and to a fifth terminal of a respective fourth switch, the fourth switch being further coupled to respective first or second output terminal of the first or second capacitive circuit, respectively,
the voltage-boosting stage further comprising a fifth switch coupled between the power stage and a positive terminal of the power supply for implementing a three-level supply-boosted power stage,
wherein the power stage comprises a sixth switch coupled between the first or second output terminal of the power stage and the negative terminal of the power supply.

13. The voltage-boosting stage as claimed in claim 12, wherein one of the fourth switch comprises at least two related switches having different equivalent resistances.

14. The voltage-boosting stage according to claim 12, wherein the voltage-boosting stage is a bridge-tied load supply-boosted power stage.

15. The voltage-boosting stage according to claim 14, wherein the first, second, third, and fourth switches have different areas.

16. The voltage-boosting stage according to claim 15, further comprising, an amplifier comprising a first pair of switches coupled between amplifier outputs and a negative terminal of the supply voltage supplying the amplifier.

17. The voltage-boosting stage according to claim 16, wherein the amplifier includes a second pair of switches coupled between the amplifier outputs and the positive terminal of the supply voltage supplying the amplifier.

18. The voltage-boosting stage according to claim 12, further comprising a class-D power amplifier circuit including a switching power amplifier coupled to a voltage source via the voltage-boosting stage.

* * * * *